(12) United States Patent
Kim et al.

(10) Patent No.: US 8,004,328 B2
(45) Date of Patent: Aug. 23, 2011

(54) AC-COUPLING PHASE INTERPOLATOR AND DELAY-LOCKED LOOP USING THE SAME

(75) Inventors: Jin-Gook Kim, Suwon-si (KR);
Kwang-II Park, Yongin-si (KR);
Seung-Jun Bae, Hwaseong-si (KR);
Si-Hong Kim, Gunpo-si (KR);
Dae-Hyun Chung, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/570,186

(22) Filed: Sep. 30, 2009

(65) Prior Publication Data

US 2010/0079180 A1    Apr. 1, 2010

(30) Foreign Application Priority Data

Oct. 1, 2008  (KR) .................. 10-2008-0096752

(51) Int. Cl.
*H03L 7/06* (2006.01)
(52) U.S. Cl. ......... 327/158; 327/235; 327/149; 327/233
(58) Field of Classification Search .................. 327/233, 327/235, 149, 158
See application file for complete search history.

(56) References Cited

U.S. PATENT DOCUMENTS

| | | | | |
|---|---|---|---|---|
| 5,614,855 A * | 3/1997 | Lee et al. | ...................... | 327/158 |
| 6,815,986 B2 * | 11/2004 | Roy et al. | ...................... | 327/149 |
| 6,911,853 B2 * | 6/2005 | Kizer et al. | ..................... | 327/158 |
| 6,934,215 B2 | 8/2005 | Chung et al. | | |
| 7,202,715 B1 * | 4/2007 | Fan | ................................ | 327/149 |
| 7,206,370 B2 * | 4/2007 | Nakao | ............................ | 375/376 |
| 7,327,174 B2 * | 2/2008 | Fan et al. | ...................... | 327/149 |
| 7,389,097 B2 * | 6/2008 | Tamura | ......................... | 455/280 |
| 7,423,469 B2 * | 9/2008 | Pickering et al. | ............. | 327/231 |
| 7,466,179 B2 * | 12/2008 | Huang et al. | .................. | 327/258 |
| 7,501,869 B2 * | 3/2009 | Fan et al. | ...................... | 327/158 |
| 7,551,013 B2 * | 6/2009 | Kim et al. | ...................... | 327/231 |
| 7,555,048 B1 * | 6/2009 | Massoumi et al. | ............ | 375/260 |
| 7,697,592 B2 * | 4/2010 | Ogasawara | .................. | 375/130 |
| 7,778,344 B2 * | 8/2010 | Gai | ................................ | 375/280 |
| 7,822,403 B2 * | 10/2010 | Tamura | ......................... | 455/334 |
| 7,915,941 B1 * | 3/2011 | Pan et al. | ...................... | 327/231 |
| 2003/0042957 A1 * | 3/2003 | Tamura | ......................... | 327/233 |
| 2003/0179027 A1 * | 9/2003 | Kizer et al. | .................... | 327/158 |
| 2004/0012420 A1 * | 1/2004 | Roy et al. | ...................... | 327/149 |
| 2004/0169539 A1 | 9/2004 | Gauthier et al. | | |
| 2006/0076997 A1 * | 4/2006 | Ogasawara | ................... | 327/291 |
| 2006/0133558 A1 * | 6/2006 | Swartz et al. | ................. | 375/371 |
| 2007/0030753 A1 | 2/2007 | Kwak | | |
| 2007/0063749 A1 * | 3/2007 | Fan | ................................ | 327/158 |

(Continued)

FOREIGN PATENT DOCUMENTS

JP    2004-103220    4/2004

(Continued)

*Primary Examiner* — Lincoln Donovan
*Assistant Examiner* — Adam D Houston
(74) *Attorney, Agent, or Firm* — F. Chau & Associates, LLC

(57) ABSTRACT

An AC-coupling phase interpolator and a DLL using the same are provided. The AC-coupling phase interpolator includes a coupling capacitor generating and outputting a coupling signal by AC-coupling to an interpolation signal obtained by phase-interpolating an input signal. Thereby, it is possible to correct duty of an input signal and adjust the level of an output signal.

11 Claims, 3 Drawing Sheets

U.S. PATENT DOCUMENTS

| | | | |
|---|---|---|---|
| 2007/0153951 A1* | 7/2007 | Lim et al. | 375/376 |
| 2007/0274413 A1* | 11/2007 | Gai | 375/280 |
| 2008/0122507 A1* | 5/2008 | Fan et al. | 327/158 |
| 2008/0204091 A1* | 8/2008 | Choo et al. | 327/149 |
| 2010/0079180 A1* | 4/2010 | Kim et al. | 327/158 |
| 2010/0090723 A1* | 4/2010 | Nedovic et al. | 327/3 |
| 2010/0090733 A1* | 4/2010 | Kristensson et al. | 327/156 |
| 2010/0272215 A1* | 10/2010 | Lin et al. | 375/316 |
| 2010/0306437 A1* | 12/2010 | Heath et al. | 710/305 |
| 2011/0001527 A1* | 1/2011 | Lee | 327/158 |
| 2011/0075781 A1* | 3/2011 | Kenney | 375/376 |

FOREIGN PATENT DOCUMENTS

| | | |
|---|---|---|
| KR | 1020040021478 A | 3/2004 |

* cited by examiner

AC-COUPLING PHASE INTERPOLATOR AND DELAY-LOCKED LOOP USING THE SAME

CROSS-REFERENCE TO RELATED APPLICATION

This application claims under 35 U.S.C. §119 priority to and the benefit of Korean Patent Application No. 10-2008-0096752, filed on Oct. 1, 2008, the entire content of which is incorporated by reference herein.

BACKGROUND

1. Technical Field

The present disclosure relates to phase interpolators, and more particularly, to an AC-coupling phase interpolator and a delay-locked loop (DLL) using the same.

2. Discussion of Related Art

In general, semiconductor devices are associated with internal circuits for finely adjusting delay times of input/output signals so as to result in various operative functions. Of note are phase interpolators which are usually employed in semiconductor devices for finely adjusting delay times of internal clock signals, etc. Such phase interpolators operate to receive two or more input signals having phases different from each other and generate a phase interpolation signal with a specific phase between phases of the input signals. The phase interpolators can be configured in a simple hardware structure, and are widely used in various types of application circuits because they can output target phases precisely.

SUMMARY

In accordance with an exemplary embodiment of the inventive concept an AC-coupling phase interpolator is provided. A phase interpolation circuit is configured to receive a first power source voltage, to generate an interpolation signal to at least one interpolation node by receiving and phase-interpolating m input signals, m being a natural number equal to or larger than 2, to include a coupling capacitor connected between the interpolation node and a first node to AC-couple and to generate a coupling signal to the first node. An output circuit is configured to receive a second power source voltage, to adjust a voltage level of the coupling signal, and to output the adjusted voltage level.

The phase interpolation circuit may further include m input inverters configured to receive and invert the input signals, and to output the inverted signals of the input signals to the interpolation node, and a filtering capacitor connected between the first node and a third power source voltage to remove noise from the coupling signal.

The phase interpolation circuit may further include m input inverters configured to receive and invert the input signals, and to output the inverted signals of the input signals, in weighting interpolation circuits configured to correspond to the m input inverters, respectively, and to generate the interpolation signal to each of the n interpolation nodes, n being a natural number, in response to corresponding output signals of the input inverters and a corresponding weighting control signal group of m weighting control signal groups each of which has n weighting control signals and n inverted weighting control signals, and a filtering capacitor connected between the first node and a third power source voltage to remove noise from the coupling signal.

Each of the m weighting interpolation circuits may include n weighting circuits configured to correspond to the n interpolation nodes, respectively, and to generate the interpolation signal to each of the interpolation nodes. Each of the n weighting circuits may include a first PMOS transistor having one terminal connected to the first power source voltage and a gate that receives a corresponding output signal of the input inverter, a first NMOS transistor having one terminal connected to the second power source voltage and a gate that receives a corresponding output signal of the input inverter, a second PMOS transistor having one terminal connected to the other terminal of the first PMOS transistor and a gate that receives a corresponding inverted weighting control signal of the n inverted weighting control signals of the corresponding weighting control signal group, and a second NMOS transistor connected between the second PMOS transistor and the first NMOS transistor, and having a gate that receives a corresponding weighting control signal of the n weighting control signals of the corresponding weighting control signal group.

One of each of the m weighting circuits connected to the same interpolation node may be activated.

The output circuit may include an amplifier having an inverter and a feedback resistor that are connected between the first node and a second node in parallel, and an output inverter configured to invert an output signal of the amplifier that is applied to the second node and to output the inverted output signal of the amplifier.

In accordance with an exemplary embodiment of the inventive concept a delay-locked loop is provided. A multi-phase delay-locked loop is configured to receive an input clock signal and to generate a plurality of delay clock signals having uniform phase intervals. A phase detector is configured to detect a phase difference between an output clock signal and a reference clock signal and to output a detection signal corresponding to the detected phase difference. A controller is configured to output a selection signal in response to the detection signal. A selector is configured to select in delay clock signals, m being a natural number equal to or larger than 2, of the plurality of delay clock signals in response to the selection signal, and to output m selection clock signals. An AC-coupling phase interpolator includes a phase interpolation circuit configured to receive a first power source voltage, to generate an interpolation signal to at least one interpolation node by receiving and phase-interpolating the m selection clock signals, to include a coupling capacitor connected between the interpolation node and a first node to AC-couple, and to generate a coupling signal to the first node, and an output circuit configured to receive a second power source voltage, to adjust a voltage level of the coupling signal, and to output an output clock signal.

The phase interpolation circuit of the AC-coupling phase interpolator of the delay-locked loop may further include m input inverters configured to receive and invert corresponding selection clock signals of the m selection clock signals, and to output the inverted selection signals, m weighting interpolation circuits configured to correspond to each of the in input inverters, and to generate the interpolation signal to each of the n interpolation nodes, n being a natural number, in response to corresponding output signals of the input inverters and a corresponding weighting control signal group of m weighting control signal groups each of which has n weighting control signals and n inverted weighting control signals, the m weighting control signal groups being generated from the controller, and a filtering capacitor connected between the first node and a third power source voltage to remove noise from the coupling signal.

Each of the m weighting interpolation circuits of the phase interpolation circuit of the AC-coupling phase interpolator of the delay-locked loop may include n weighting circuits configured to correspond to each of the n interpolation nodes, and to generate the interpolation signal to each of the interpolation nodes, wherein each of the n weighting circuits includes a first PMOS transistor having one terminal connected to the first power source voltage and a gate that receives a corresponding output signal of the input inverter, a first NMOS transistor having one terminal connected to the second power source voltage and a gate that receives a corresponding output signal of the input inverter, a second PMOS transistor having one terminal connected to the other terminal of the first PMOS transistor and a gate that receives a corresponding inverted weighting control signal of the n inverted weighting control signals of the corresponding weighting control signal group, and a second NMOS transistor connected between the second PMOS transistor and the first NMOS transistor, and having a gate that receives a corresponding weighting control signal of the n weighting control signals of the corresponding weighting control signal group.

The output circuit of the AC-coupling phase interpolator of the delay-locked loop may include an amplifier having an inverter and a feedback resistor that are connected between the first node and a second node in parallel, and an output inverter configured to invert an output signal of the amplifier that is applied to the second node, and to output the output clock signal.

In accordance with an exemplary embodiment of the inventive concept a phase interpolation circuit includes two or more input inverters that each operate at a first voltage level and that each receive a respective input signal having respective phases, and invert and output an inverted input signal at the first voltage level, an interpolation node coupled to the output of each input inverter such that output signals of the two or more input inverters are phase-interpolated and merged at the interpolation node into an interpolation signal that has an intermediate phase between the phases of the two or more input signals, a DC blocking capacitor interposed between the interpolation node and a phase-interpolator circuit output node such that the interpolation signal is AC coupleable to the phase interpolator circuit output node as an AC coupled interpolation signal, and a filtering capacitor interposed between the phase interpolator circuit output and a second voltage.

The phase interpolation circuit may further include an output circuit comprising an amplifier that adjusts a DC level of the AC coupled interpolation signal to provide an DC level adjusted AC coupled interpolation signal, and an output inverter that inverts the DC level adjusted AC coupled interpolation signal to provide a DC level adjusted AC coupled phase interpolated output signal at an output inverter output node.

The amplifier may include an amplifier inverter and a feedback resistor that are connected in parallel between the phase-interpolator circuit output node and an input to the output inverter.

The amplifier inverter and the output inverter of the output circuit may operate at a power source voltage level different from the first power source voltage level.

Each input inverter may include a respective weight interpolation circuit coupled to the output of each input inverter, each weight interpolation circuit being configured to control the phase of the output signal of the respective input inverter. The DC blocking capacitor may include a plurality of DC blocking capacitors coupled in parallel between the phase interpolation circuit output node and a respective output of each weight interpolation circuit.

BRIEF DESCRIPTION OF THE DRAWINGS

Exemplary embodiments are described in further detail below with reference to the accompanying drawings. It should be understood that various aspects of the drawings may have been exaggerated for clarity.

DETAILED DESCRIPTION OF THE EMBODIMENTS

Detailed illustrative embodiments are disclosed herein. However, specific structural and functional details disclosed herein are merely for describing exemplary embodiments. The inventive concept, however, may be embodied in many alternate forms and should not be construed as limited to the exemplary embodiments set forth herein.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Hereinafter, exemplary embodiments of an AC-coupling phase interpolator and a DLL using the AC-coupling phase interpolator will be described with reference to the accompanying drawings.

Figure 1:
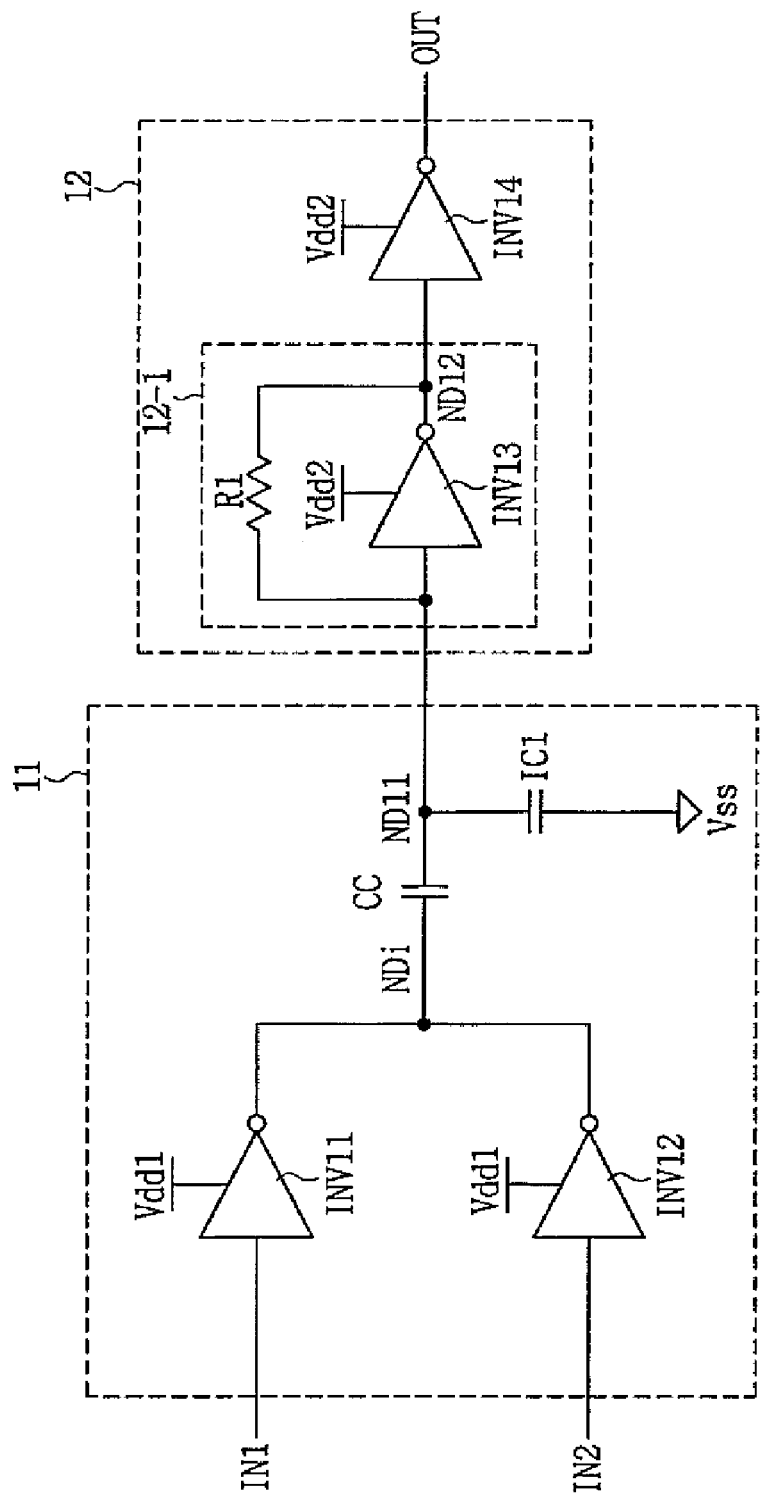
FIG. 1 is a circuit diagram illustrating an exemplary embodiment of an AC-coupling phase interpolator.

FIG. 1 is a circuit diagram illustrating an exemplary embodiment of an AC-coupling phase interpolator.

The AC-coupling phase interpolator shown in FIG. 1 includes a phase interpolation circuit 11 for receiving and phase-interpolating a plurality of input signals IN1, IN2 and generating a coupling signal, which is set by AC-coupling, to a first node ND11 in response to the phase-interpolated signal, and an output circuit 12 for adjusting the level of the coupling signal generated from the first node ND11 and outputting the adjusted coupling signal.

The phase interpolation circuit 11 includes a first input inverter INV11, a second input inverter INV12, a coupling capacitor CC, and a filtering capacitor IC1. The first input inverter INV11 receives and logically inverts a first input signal IN1, and applies the inverted first input signal to an interpolation node NDi. The second input inverter INV12 receives and logically inverts a second input signal IN2, and applies the inverted second input signal to the interpolation node NDi. The coupling capacitor CC provides the first node ND11 with a coupling signal which is generated by AC-coupling in response to a phase-interpolated signal applied to the interpolation node NDi. The filtering capacitor IC1 is interposed between the first node ND11 and a third power source voltage Vss to remove noise from the coupling signal applied to the first node ND11. Because the first and second input inverters INV11, INV12 operate with a first power source voltage Vdd1, the level of the first power source voltage Vdd1 is the same as a first level of output signals of the first and second input inverters INV11, INV12 and a first level of the interpolation signal that is phase-interpolated at the interpolation node NDi. FIG. 1 depicts an embodiment in which two input signals IN1, IN2 are applied to the phase interpolator, and thus the interpolation circuit 11 has been shown as having two input inverters INV11, INV12. But exemplary embodiments can be configured such that two or more (m) input signals (m being a natural number larger than 2) are applied to the phase interpolator. If m input signals are applied to the phase interpolator, a plurality of input inverters, which each receive a corresponding input signal of the plurality of input signals and apply a phase-interpolated signal to the interpolation node NDi, are included.

The output circuit 12 includes an amplifier 12-1 that adjusts a DC level of the coupling signal applied to the first node ND11 and outputs the adjusted DC level of the coupling signal to a second node ND12, and an output inverter INV14 that logically inverts a signal of the second node ND12 and outputs the result. The amplifier 12-1 includes an inverter INV13 and a feedback resistor R1 that are connected between the first and second nodes ND11, ND12 in parallel. The feedback resistor R1 functions to maintain a second level of the coupling signal, which is applied to the first node ND11, on a threshold voltage of the inverter INV13 so that the coupling signal applied to the first node ND11 is easily sensed and amplified. The two inverters INV13, INV14 of the output circuit 12 operate with a second power source voltage Vdd2, different from the plural inverters INV11, INV12 of the phase interpolation circuit 11. In the phase interpolator according to the exemplary embodiment, although the phase interpolation circuit 11 is operated by the first power source voltage Vdd1, since DC flow between the phase interpolation circuit 11 and the output circuit 12 is blocked by coupling capacitance (CC), it does not matter if the second power source voltage Vdd2 applied to the output circuit 12 is different from the first power source voltage Vdd1 in voltage level. In other words, the phase interpolation circuit 11 and the output circuit 12 can operate in different levels of the power source voltages Vdd1, Vdd2, respectively.

Now, the operation of the phase interpolator according to an exemplary embodiment will be described with reference to FIG. 1. If the first and second input inverters INV11, INV12 receive and invert the input signals IN1, IN2, and then output the inverted signals to the interpolation node NDi, respectively, the output signals of the first and second input inverters INV11, INV12 are phase-interpolated and merged into an interpolation signal that has an intermediate phase between the first and second input signals IN1, IN2. A change in level of the interpolation signal due to AC-coupling at the coupling capacitor CC results in generation of a coupling signal opposite to the interpolation signal in phase at the first node ND11. The filtering capacitor IC1 removes noise from the coupling signal. The amplifier 12-1 inverts and adjusts the level of the coupling signal generated at the first node ND11 and outputs the adjusted coupling signal to the second node ND12. The output inverter INV14 inverts the signal output to the second node ND12 and outputs an output signal OUT. Since the phase interpolation circuit 11 operates with the first power source voltage Vdd1 as described above, a first level of the coupling signal has the level of the first power source voltage Vdd1. However, since the output circuit 12 operates with the second power source voltage Vdd2, a first level of the output signal OUT output from the output circuit 12 is level-shifted to the second power source voltage Vdd2 and then output. In other words, the phase interpolator shown in FIG. 1 may function not only as a phase interpolation unit, but also as a level shifter.

Additionally, in the phase interpolator shown in FIG. 1, since the coupling signal is generated by AC-coupling at the coupling capacitor CC to the interpolation signal, a DC component of the interpolation signal is blocked and an AC component of the interpolation signal is coupled and transferred to the amplifier 12-1 of the output circuit 12. Therefore, an offset of the amplifier 12-1 is counterbalanced and the duty cycle of the coupling signal is corrected.

Further, when the two input signals IN1, IN2 are applied to the phase interpolator shown in FIG. 1, the output signal OUT has an intermediate phase between the input signals IN1, IN2. However, the output signal OUT of the phase interpolator sometimes can be generated with a phase other than an average phase of the plurality of input signals.

In general, a method of adjusting the output signal OUT of the phase interpolator to have a phase other than an average phase of the input signals IN1, IN2 is to adjust the output currents of the input inverters INV11, INV12. For instance, when the first input signal IN1 is earlier than the second input signal IN2 in phase, if the first and second input inverters INV11, INV12 are driven such that the current output from the first input inverter INV11 is larger than the current output from the second input inverter INV12, the phase of the output signal OUT of the phase interpolator can be earlier than the intermediate phase of the first and second input signals IN1, IN2. But, as shown in FIG. 1, since the interpolation signal generated from the interpolation node NDi is applied to the output circuit 12 through the coupling capacitor CC, an increase in current due to one of the first and second input inverters INV11, INV12 increasing in drivability may cause a large amount of voltage drop by the coupling capacitor CC. Such as a voltage drop can actually cause distortion of the output signal OUT, since the phase cannot be controlled even when the current is raised for phase adjustment.

Figure 2:
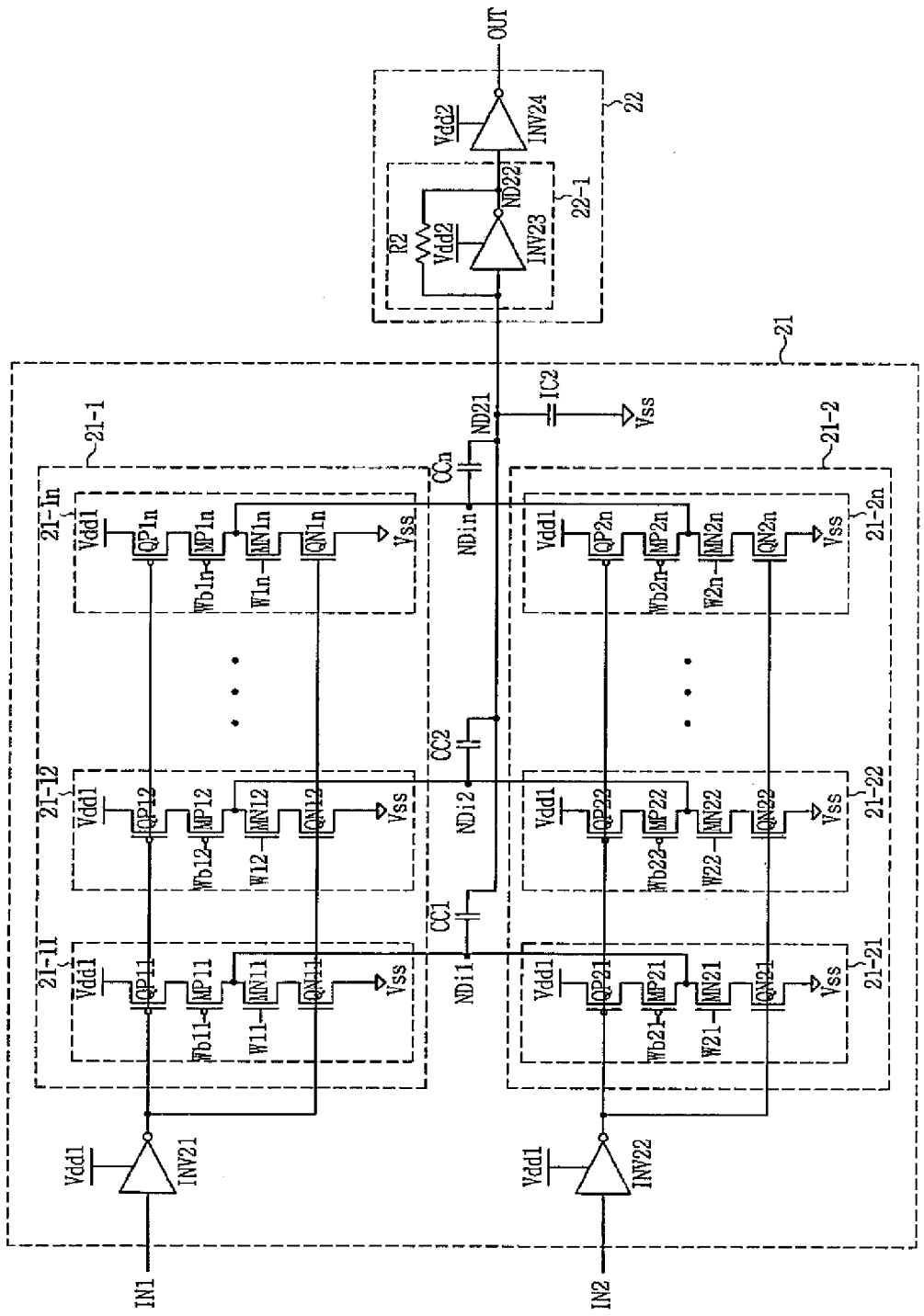
FIG. 2 is a circuit diagram illustrating another exemplary embodiment of an AC-coupling phase interpolator.

FIG. 2 is a circuit diagram illustrating another exemplary embodiment of an AC-coupling phase interpolator, which is configured to be capable of adjusting the phase of its output signal.

A voltage drop by a coupling capacitor CC is given in Equation 1.

$$V = \frac{I}{j\omega C} \qquad \text{[Equation 1]}$$

As seen in Equation 1, if a capacitance C of the coupling capacitor CC is raised as much as the current output from the input inverters, the voltage drop at both terminals of the coupling capacitor CC remains constant and the phase adjustment is easier. That is, it is possible to adjust the phase of the output signal OUT by adjusting the capacitance C of the coupling capacitor CC and the current.

Now, the operation of the phase interpolator according to an exemplary embodiment will be described with reference to FIG. 2. As in the phase interpolator of FIG. 1, the phase interpolator of FIG. 2 includes a phase interpolation circuit 21 that receives and phase-interpolates first and second input signals IN1, IN2, and generates a coupling signal by AC-coupling to a first node ND21 in response to the phase interpolated signal, and an output circuit 22 that adjusts a level of the coupling signal of the first node ND21 and outputs the level-adjusted coupling signal. However, in the phase interpolator of FIG. 2, input inverters INV21, INV22 do not output signals directly to interpolation nodes NDi1, NDi2, ... NDin, and weight interpolation circuits 21-1, 21-2 respectively corresponding to the input inverters INV21, INV22 are further included. The weight interpolation circuits 21-1, 21-2 receiving first and second weighting control signal groups adjust the phase of the coupling signal generated at the first node ND21.

The phase interpolation circuit 21 includes the first and second input inverters INV21, INV22 inverting and outputting the first and second input signals IN1, IN2 respectively, the first and second weighting interpolation circuits 21-1, 21-2 corresponding to the first and second input inverters INV21, INV22, respectively, and generating interpolation signals to each of the interpolation nodes NDi1, NDi2, ... NDin, a plurality of coupling capacitors CC1, CC2, ... CCn connected between the interpolation nodes NDi1, NDi2, ... NDin and the first node ND21, respectively, and a filtering capacitor 1C2 removing noise from the coupling signal. The first and second weighting interpolation circuits 21-1, 21-2 receive the first and second weighting control signal groups. The first and second weighting control signal groups are each composed of n weighting control signals W11, W12, ... W1n and W21, W22, ... W2n, (where n is a natural number) and n inverted weighting control signals Wb11, Wb12, ... Wb1n and Wb21, Wb22, ... Wb2n.

The first weighting interpolation circuit 21-1 includes n first weighting circuits 21-11, 21-12, ... 21-1n. The first weighting circuits 21-11, 21-12, ... 21-1n each generate the interpolation signal to the corresponding interpolation nodes NDi1 to NDin by responding to the corresponding first weighting control signals W11, W12, ... W1n and the corresponding first inverted weighting control signals Wb11, Wb12, ... Wb1n of the first weighting control signal group, and by responding to an output signal of the first inverter INV21. The second weighting interpolation circuit 21-2 includes n second weighting circuits 21-21, 21-22, ... 21-2n. The second weighting circuits 21-21, 21-22, ... 21-2n each generate the interpolation signals to the corresponding interpolation nodes NDi1, NDi2, ... NDin by responding to the corresponding second weighting control signals W21, W22, ... W2n and the corresponding second inverted weighting control signals Wb21, Wb22, ... Wb2n of the second weighting control signal group, and by responding to an output signal of the second inverter INV22.

Each of the first weighting circuits 21-11, 21-12, ... 21-1n includes a first PMOS transistor QP11, QP12, ... QP1n having one terminal connected to a first power source voltage Vdd1 and a gate receiving the output signal of the first inverter INV21, a first NMOS transistor QN11, QN12, ... QN1n having one terminal connected to a third power source voltage Vss and a gate receiving the output signal of the first inverter INV21 as in the first PMOS transistor QP11, QP12, ... QP1n, a second PMOS transistor MP11, MP12, ... MP1n having one terminal connected to the other terminal of the first PMOS transistor QP11, QP12, ... QP1n and a gate receiving a corresponding one of the inverted weighting control signals Wb11, Wb12, ... Wb1n of the first weighting control signal group, and a second NMOS transistor MN11, MN12, ... MN1n connected between the second PMOS transistor MP11, MP12, ... MP1n and the first NMOS transistor QN11, QN12, ... QN1n and having a gate receiving a corresponding one of the weighting control signals W11, W12, ... W1n of the first weighting control signal group.

Similar to the first weighting circuits 21-11, 21-12, ... 21-1n, each of the second weighting circuits 21-21, 21-22, ... 21-2n includes a first PMOS transistor QP21, QP22, ... QP2n having one terminal connected to the first power source voltage Vdd1 and a gate receiving the output signal of the second inverter INV22, a first NMOS transistor QN21, QN22, ... QN2n having one terminal connected to the third power source voltage Vss and a gate receiving the output signal of the second inverter INV22 as in the first PMOS transistor QP21, QP22, ... QP2n, a second PMOS transistor MP21, MP22, ... MP2n having one terminal connected to the other terminal of the first PMOS transistor QP21, QP22, ... QP2n and a gate receiving a corresponding one of the inverted weighting control signals Wb21, Wb22, ... Wb2n of the second weighting control signal group, and a second NMOS transistor MN21, MN22, ... MN2n connected between the second PMOS transistor MP21, MP22, ... MP2n and the first NMOS transistor QN21, QN22, ... QN2n and having a gate receiving a corresponding one of the weighting control signals W21, W22, ... W2n of the second weighting control signal group.

Here, the n first weighting circuits 21-11, 21-12, ... 21-1n and the n second weighting circuits 21-21, 21-22, ... 21-2n are not all activated at the same time in response to the weighting control signals W11, W12, ... W1n and the weighting control signals W21, W22, ... W2n and the inverted weighting control signals Wb11, Wb12, ... Wb1n and the inverted weighting control signals Wb21, Wb22, ... Wb2n of the first and second weighting control signal groups. In other words, the weighting control signals W11, W12, ... W1n and the weighting control signals W21, W22, ... W2n are activated one at a time in correspondence with the first and second weighting control signal groups. If the weighting control signal W11 of the first weighting control signal group is activated, the weighting control signal W21 of the second weighting control signal group is inactivated, and if the weighting control signal W1n of the first weighting control signal group is inactivated, the weighting control signal W2n of the second weighting control signal group is activated. Thus, in the phase interpolator of FIG. 2 that receives two input signals, the first weighting control signal group may be inverted and used as the second weighting control signal group, without discriminating the first and second weighting control signal groups from each other.

The output circuit 22 operates the same as the output circuit 12 shown in FIG. 1. The output circuit 22 includes an amplifier 22-1 that adjusts a DC level of the coupling signal applied to the first node ND21 and outputs the adjusted DC level of the coupling signal to a second node ND22, and an output inverter INV24 that logically inverts a signal of the second node ND22 and outputs the result. The amplifier 22-1 includes an inverter INV23 and a feedback resistor R2 that are connected between the first and second nodes ND21, ND22 in parallel. The feedback resistor R2 functions to maintain a second level of the coupling signal, which is applied to the first node ND21, on a threshold voltage of the inverter INV23 so that the coupling signal applied to the first node ND21 is easily sensed and amplified. The two inverters INV23, INV24 of the output circuit 22 operate with a second power source voltage Vdd2, different from the plural inverters INV21, INV22 of the phase interpolation circuit 21. In the phase interpolator according to this exemplary embodiment, although the phase interpolation circuit 21 is operated by the first power source voltage Vdd1, since DC flow between the phase interpolation circuit 21 and the output circuit 22 is blocked by coupling capacitances CC1, CC2, ... CCn, it does not matter if the second power source voltage Vdd2 applied to the output circuit 22 is different from the first power source voltage Vdd1 in voltage level. In other words, the phase interpolation circuit 21 and the output circuit 22 can operate in different levels of the power source voltages Vdd1, Vdd2, respectively.

As mentioned above, the phase interpolator of FIG. 2 includes the first and second weighting interpolation circuits 21-1, 21-2 corresponding to the first and second input signals IN1, IN2, respectively. Each of the weighting interpolation circuits 21-1, 21-2 includes the n weighting circuits 21-11, 21-12, . . . 21-1n and the n weighting circuits 21-21, 21-22, . . . 21-2n respectively, which are selectively activated. The weighting circuits 21-11, 21-12, . . . 21-1n and the weighting circuits 21-21, 21-22, . . . 21-2n selectively generate the interpolation signals of the input signals IN1, IN2 to the interpolation nodes NDi1, NDi2, . . . NDin. The interpolation signal selectively generated is provided to generate the coupling signal at the first node ND21 by the coupling capacitors CC1, CC2, . . . CCn placed in parallel between the interpolation nodes NDi1, NDi2, . . . NDin and the first node ND21. In other words, as the coupling capacitors CC1, CC2, . . . CCn are arranged to correspond to the signals applied from the selectively activated weighting circuits, 21-11, 21-12, . . . 21-1n and weighting circuits 21-21, 21-22, . . . 21-2n respectively, the voltage drop by the coupling capacitors CC1, CC2, . . . CCn is maintained at a constant rate in accordance with Equation 1. As a result, the phase of the coupling signal is adjusted without distortion.

As in the phase interpolator of FIG. 1, since the exemplary embodiment of the phase interpolator of FIG. 2 is depicted as operating with two of the input signals IN1, IN2, the phase interpolation circuit 21 includes two input inverters INV21, INV22. However, the phase interpolator according to an exemplary embodiment of the inventive concept can receive two or more input signals. When there are two or more input signals, the phase interpolator of FIG. 2 would include the same number of the weighting interpolation circuits 21-1, 21-2 as well as the input inverters INV21, INV22. For instance, a phase interpolator receiving m input signals (where m is a natural number larger than 2) would include m input inverters, and m weighting interpolation circuits respectively corresponding to the m input inverters. Further, the phase interpolator with the m input signals would receive m weighting control signal groups for selectively activating n weighting circuits of each of the m weighting interpolation circuits. And, as mentioned above, weighting control signals corresponding to each of the m weighting control signal groups are activated one at a time.

Figure 3:
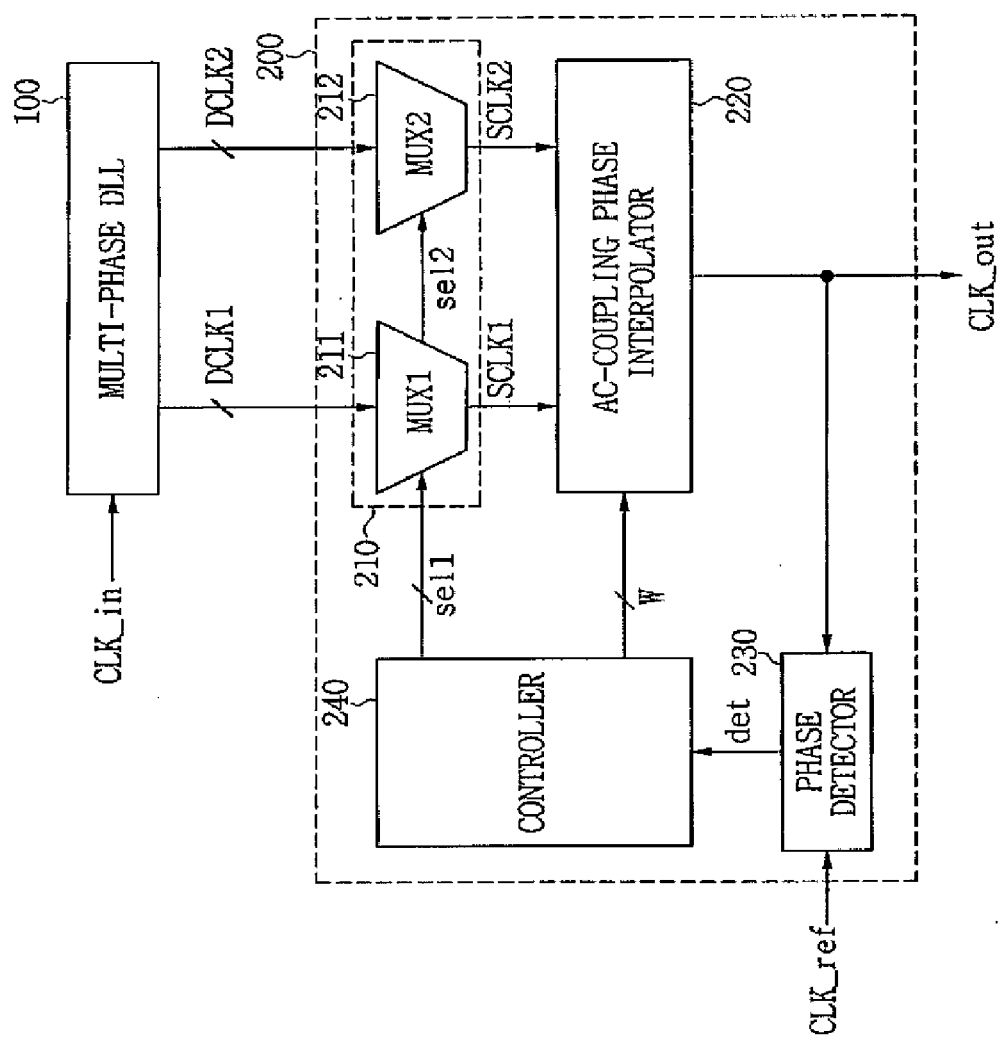
FIG. 3 is a block diagram illustrating an exemplary embodiment of a DLL using the AC-coupling phase interpolator shown in FIG. 2.

FIG. 3 is a block diagram illustrating an exemplary embodiment of a delay-locked loop (DLL) using the exemplary embodiment of an AC-coupling phase interpolator shown in FIG. 2.

A DLL is a primary system having a smaller jitter than a phase-locked loop (PLL) because there is no accumulation of phase noise on a voltage-controlled delay line (VCDL), and a fast locktime due to its excellent frequency stability. On the other hand, the PLL acts as a secondary system, which may cause phase noise to accumulate in a voltage-controlled oscillator (VCO) due to feedback characteristics thereof. Thus, the DLL is widely used in clock synchronization and clock generation with various phases due to its jitter properties and stability. But the DLL operates in a narrower range of operating frequency, in which an output clock characteristic is dependent on an input clock characteristic. To resolve such issue, a dual-loop DLL can be used.

The dual-loop DLL operates to overcome the limitation of frequency range in the generation of a new clock signal by merging phases of two clock signals among clock signals that are uniformly divided from a 360° phase. Therefore, the dual-loop DLL has a seamless phase-shifting function due to its phase synthesis feature. In other words, it is possible to increase or decrease the phase of an output clock signal of the DLL while keeping the phase locked.

The DLL of FIG. 3 is an exemplary embodiment of a dual-loop DLL, which includes a coarse loop 100 and a fine loop 200. The coarse loop 100 can be implemented as a multi-phase DLL that receives an input clock signal CLK_in and that generates first and second delay clock signal groups DCLK1, DCLK2 each of which has a plurality of delay clock signals with a uniform phase interval in synchronization with the input clock signal CLK_in. For example, if the plurality of delay clock signals of the first delay clock signal group DCLK1 are generated in phases of 0°, 90°, 180°, and 270°, the plurality of delay clock signals of the second delay clock signal group DCLK2 are generated in phases of 45°, 135°, 225°, and 315°.

The fine loop 200 includes a selector 210, an AC-coupling phase interpolator 220, a phase detector 230, and a controller 240. The phase detector 230 detects a phase difference between a reference clock signal CLK_ref and an output clock signal CLK_out provided from the AC-coupling phase interpolator 220, and outputs the phase detection signal det corresponding to the detected phase difference. Here, the reference clock signal CLK_ref is provided to determine a phase of the output clock signal CLK_out. While the input clock signal CLK_in is generally used as the reference clock signal CLK_ref, another signal may used. The controller 240 outputs a plurality of weighting control signal groups W to the AC-coupling phase interpolator 220 in response to the detection signal det, and outputs first and second selection signals sel1, sel1 to first and second multiplexers (MUX1, MUX2) 211, 212 of the selector 210, respectively. The first and second multiplexers 211, 212 respectively select one from the plurality of delay clock signals of the first and second delay clock signal groups DCLK1, DCLK2 in response to the first and second selection signals sel1, sel2, and output the selected signals to the AC-coupling phase interpolator 220 as first and second selection clock signals SCLK1, SCLK2. The AC-coupling phase interpolator 220, such as the exemplary embodiment of the phase interpolator shown in FIG. 2, receives the first and second selection clock signals SCLK1, SCLK1 as input signals IN1, IN2 from the first and second multiplexers 211, 212, and generates the output clock signal CLK_out by phase-interpolating and level-shifting the first and second selection clock signals SCLK1, SCLK1.

The preceding description described the coarse loop 100 generating the first and second delay clock signal groups DCLK1, DCLK2 each having the plurality of delay clock signals with a uniform phase interval, and the first and second multiplexers 211, 212 of the selector 210 outputting the first and second selection clock signals SCLK1, SCLK2 by selecting ones from the plurality of delay clock signals of the first and second delay clock signal groups DCLK1, DCLK2 in response to the first and second selection signals sell, sell. However, the selector 210 can be configured in various forms and the coarse loop 100 can output the plurality of delay clock signals without distinguishing them into the first and second clock signal groups DCLK1, DCLK2. In other words, when the plurality of delay clock signals are supplied from the coarse loop 100, the selector 210 of the fine loop 200 can output the first and second selection clock signals SCLK1, SCLK2 by selecting two signals from the plurality of delay clock signals in response to the selection signals.

As described above, the phase interpolator of FIG. 2 can adjust the phase of the output signal with the plurality of weighting control signals, as well as interpolating a phase of the input signal. Moreover, it is possible to correct and adjust the duty cycle and level of the output signal and simplify the configuration of the dual-loop DLL.

Accordingly, in an AC-coupling phase interpolator according to at least one exemplary embodiment of the inventive concept, duty cycles and shift levels are corrected while interpolating phases of input signals.

The foregoing is illustrative of exemplary embodiments and is not to be construed as limiting thereto. Although exemplary embodiments have been described, those skilled in the art will readily appreciate that many modifications are possible without materially departing from the inventive concept. Accordingly, all such modifications are intended to be included within the scope of this inventive concept as defined in the claims.

What is claimed is:

1. An AC-coupling phase interpolator comprising:
   a phase interpolation circuit configured to receive a first power source voltage, to generate an interpolation signal to at least one interpolation node by receiving and phase-interpolating m input signals, m being a natural number equal to or larger than 2, to include a coupling capacitor connected between the interpolation node and a first node to AC-couple and to generate a coupling signal to the first node; and
   an output circuit configured to receive a second power source voltage, to adjust a voltage level of the coupling signal, and to output the adjusted voltage level.

2. The AC-coupling phase interpolator according to claim 1, wherein the phase interpolation circuit further comprises:
   m input inverters configured to receive and invert the m input signals, and to output inverted signals of the input signals to the interpolation node; and
   a filtering capacitor connected between the first node and a third power source voltage to remove noise from the coupling signal.

3. The AC-coupling phase interpolator according to claim 1, wherein the phase interpolation circuit further comprises:
   m input inverters configured to receive and invert the m input signals, and to output the inverted signals of the input signals;
   m weighting interpolation circuits configured to correspond to the m input inverters, respectively, and to generate the interpolation signal to each of n interpolation nodes, n being a natural number, in response to corresponding output signals of the input inverters and a corresponding weighting control signal group of m weighting control signal groups each of which has n weighting control signals and n inverted weighting control signals; and
   a filtering capacitor connected between the first node and a third power source voltage to remove noise from the coupling signal.

4. The AC-coupling phase interpolator according to claim 3,
   wherein each of the m weighting interpolation circuits comprises n weighting circuits configured to correspond to the n interpolation nodes, respectively, and to generate the interpolation signal to each of the interpolation nodes, and
   wherein each of the n weighting circuits comprises:
      a first PMOS transistor having one terminal connected to the first power source voltage and a gate that receives a corresponding output signal of the input inverter;
      a first NMOS transistor having one terminal connected to the second power source voltage and a gate that receives a corresponding output signal of the input inverter;
      a second PMOS transistor having one terminal connected to the other terminal of the first PMOS transistor and a gate that receives a corresponding inverted weighting control signal of the n inverted weighting control signals of the corresponding weighting control signal group; and
      a second NMOS transistor connected between the second PMOS transistor and the first NMOS transistor, and having a gate that receives a corresponding weighting control signal of the n weighting control signals of the corresponding weighting control signal group.

5. The AC-coupling phase interpolator according to claim 3, wherein one of each of the m weighting circuits connected to the same interpolation node is activated.

6. The AC-coupling phase interpolator according to claim 1, wherein the output circuit comprises:
   an amplifier having an inverter and a feedback resistor that are connected between the first node and a second node in parallel; and
   an output inverter configured to invert an output signal of the amplifier that is applied to the second node and to output the inverted output signal of the amplifier.

7. A delay-locked loop comprising:
   a multi-phase delay-locked loop configured to receive an input clock signal and to generate a plurality of delay clock signals having uniform phase intervals;
   a phase detector configured to detect a phase difference between an output clock signal and a reference clock signal and to output a detection signal corresponding to the detected phase difference;
   a controller configured to output a selection signal in response to the detection signal;
   a selector configured to select m delay clock signals, m being a natural number equal to or larger than 2, of the plurality of delay clock signals in response to the selection signal, and to output m selection clock signals; and
   an AC-coupling phase interpolator including:
      a phase interpolation circuit configured to receive a first power source voltage, to generate an interpolation signal to at least one interpolation node by receiving and phase-interpolating the m selection clock signals, to include a coupling capacitor connected between the interpolation node and a first node to AC-couple, and to generate a coupling signal to the first node; and
      an output circuit configured to receive a second power source voltage, to adjust a voltage level of the coupling signal, and to output an output clock signal.

8. The delay-locked loop according to claim 7, wherein the phase interpolation circuit further comprises:
   m input inverters configured to receive and invert corresponding selection clock signals of the m selection clock signals, and to output inverted selection signals;
   m weighting interpolation circuits configured to correspond to each of the m input inverters, and to generate the interpolation signal to each of n interpolation nodes, n being a natural number, in response to corresponding output signals of the input inverters and a corresponding weighting control signal group of m weighting control signal groups each of which has n weighting control signals and n inverted weighting control signals, the m weighting control signal groups being generated from the controller; and a filtering capacitor connected between the first node and a third power source voltage to remove noise from the coupling signal.

9. The delay-locked loop according to claim 8,
wherein each of the m weighting interpolation circuit comprises n weighting circuits configured to correspond to each of the n interpolation nodes, and to generate the interpolation signal to each of the interpolation nodes, and
wherein each of the n weighting circuits comprises:
- a first PMOS transistor having one terminal connected to the first power source voltage and a gate that receives a corresponding output signal of the input inverter;
- a first NMOS transistor having one terminal connected to the second power source voltage and a gate that receives a corresponding output signal of the input inverter;
- a second PMOS transistor having one terminal connected to the other terminal of the first PMOS transistor and a gate that receives a corresponding inverted weighting control signal of the n inverted weighting control signals of the corresponding weighting control signal group; and
- a second NMOS transistor connected between the second PMOS transistor and the first NMOS transistor, and having a gate that receives a corresponding weighting control signal of the n weighting control signals of the corresponding weighting control signal group.

10. The delay-locked loop according to claim 7, wherein the output circuit comprises:
an amplifier having an inverter and a feedback resistor that are connected between the first node and a second node in parallel; and
an output inverter configured to invert an output signal of the amplifier that is applied to the second node, and to output the output clock signal.

11. A phase interpolation circuit comprising:
two or more input inverters that each operate at a first voltage level and that each receive a respective input signal having respective phases, and invert and output an inverted input signal at the first voltage level;
an interpolation node coupled to an output of each input inverter such that output signals of the two or more input inverters are phase-interpolated and merged at the interpolation node into an interpolation signal that has an intermediate phase between the phases of the two or more input signals;
a DC blocking capacitor interposed between the interpolation node and a phase-interpolator circuit output node such that the interpolation signal is AC coupleable to the phase interpolator circuit output node as an AC coupled interpolation signal; and
a filtering capacitor interposed between the phase interpolator circuit output and a second voltage,
wherein each input inverter includes a respective weight interpolation circuit coupled to the output of each input inverter, each weight interpolation circuit configured to control the phase of the output signal of the respective input inverter, and
wherein the DC blocking capacitor comprises a plurality of DC blocking capacitors coupled in parallel between the phase interpolation circuit output node and a respective output of each weight interpolation circuit.

* * * * *